United States Patent
Dong et al.

(10) Patent No.: US 11,535,795 B2
(45) Date of Patent: Dec. 27, 2022

(54) BIPOLAR SHELL RESURFACED PEROVSKITE QUANTUM DOTS

(71) Applicants: Huawei Technologies Canada Co., Ltd., Kanata (CA); The Governing Councol of the University of Toronto, Toronto (CA)

(72) Inventors: Yitong Dong, Toronto (CA); Quan Lyu, Ipswich (GB); Giovanni Francesco Cotella, Ipswich (GB); Peter Chun, Richmond Hill (CA); Ya-Kun Wang, Toronto (CA); Fanglong Yuan, Toronto (CA); Edward Sargent, Toronto (CA); Sjoerd Hoogland, Toronto (CA); Makhsud Saidaminov, Victoria (CA)

(73) Assignees: HUAWEI TECHNOLOGIES CANADA CO., LTD., Kanata (CA); THE GOVERNING COUNCIL OF THE UNIVERSITY OF TORONTO, Toronto (CA)

(*) Notice: Subject to any disclaimer, the term of this patent is extended or adjusted under 35 U.S.C. 154(b) by 0 days.

(21) Appl. No.: 17/094,509

(22) Filed: Nov. 10, 2020

(65) Prior Publication Data
US 2022/0145170 A1 May 12, 2022

(51) Int. Cl.
| | |
|---|---|
| C09K 11/02 | (2006.01) |
| C09D 11/38 | (2014.01) |
| C09K 11/66 | (2006.01) |
| C09D 11/36 | (2014.01) |
| H01L 33/26 | (2010.01) |
| H01L 33/06 | (2010.01) |
| C09D 5/22 | (2006.01) |
| C01G 21/00 | (2006.01) |
| B82Y 20/00 | (2011.01) |
| B82Y 40/00 | (2011.01) |

(52) U.S. Cl.
CPC ............... *C09K 11/02* (2013.01); *C09D 5/22* (2013.01); *C09D 11/36* (2013.01); *C09D 11/38* (2013.01); *C09K 11/025* (2013.01); *C09K 11/664* (2013.01); *H01L 33/06* (2013.01); *H01L 33/26* (2013.01); *B82Y 20/00* (2013.01); *B82Y 40/00* (2013.01); *C01G 21/006* (2013.01); *H01L 2933/0008* (2013.01)

(58) Field of Classification Search
CPC ........ C09K 11/02; C09K 11/664; C09D 5/22; C09D 11/36; H01L 33/06; H01L 33/26
See application file for complete search history.

(56) References Cited

U.S. PATENT DOCUMENTS

| | | | |
|---|---|---|---|
| 10,047,284 B2* | 8/2018 | Lee | C09K 11/025 |
| 10,700,236 B2* | 6/2020 | Steckel | C09K 11/892 |
| 2018/0090312 A1 | 3/2018 | Pickett et al. | |

FOREIGN PATENT DOCUMENTS

| | | |
|---|---|---|
| CN | 107603614 A | 1/2018 |
| CN | 108269940 A | 7/2018 |
| CN | 109791995 A | 5/2019 |
| CN | 110157408 A | 8/2019 |
| CN | 111500287 A | 8/2020 |
| WO | 2019075570 A1 | 4/2019 |

OTHER PUBLICATIONS

Dong et al, "Bipolar shell resurfacing for blue LEDs based on strongly confined perosvkite quantum dots", Nature Nanotechnolgy, vol. 15, Aug. 2020, p. 668-674, published online Jul. 6, 2020.*
Supplementary Information for the Dong et al article.*
De Roo, J. et al. Highly dynamic ligand binding and light absorption coefficient of cesium lead bromide perovskite nanocrystals, ACS Nano 10, 2071-2081 2016.
Wheeler, L. M. et al. "Targeted ligand-exchange chemistry on cesium lead halide perovskite quantum dots for high-efficiency photovoltaics" J. Am. Chem. Soc. 140, 10504-10513 2018.
Sanehira, E., et al., "Enhanced mobility CsPbI3 quantum dot arrays for record-efficiency, high-voltage photovoltaic cells" Oct. 27, 2017.
Yitong Dong et al. "Bipolar-shell resurfacing for blue LEDs based on strongly confined perovskite quantum dots Nature Nanotechnology", Aug. 2020, 9 pages.
David P. Nenon et al. "Design Principles for Trap-Free CsPbX3 Nanocrystals: Enumerating and Eliminating Surface Halide Vacancies with Softer Lewis Bases", 2018, 45 pages.
Takayuki Chiba et al. "Anion-exchange red perovskite quantum dots with ammonium iodine salts for highly efficient light-emitting devices" Nature Photonics Nov. 30, 2018(Nov. 30, 2018) vol. 12 pp. 681-687.

* cited by examiner

*Primary Examiner* — C Melissa Koslow (57) ABSTRACT

Methods are disclosed to restore the halide ions lost in the purification (ligand removal) of photoluminescent cesium lead halide or FA lead halide perovskite quantum dots. Quantum dots thus prepared can be used to deposit solid films with high packing density featuring dots with <0.4 nm gaps therebetween, low trap density ¹/₄₀ of previously reported, high mobility 100× previously reported, high photoluminescent quantum yield exceeding 90%, high external quantum yield exceeding 20%, and increased stability under electrical current. The quantum dots are used to formulate inks suitable for ink jet printing, drop casting, spin coating, and other solution-based methods for forming emissive layers used in light producing semiconductor devices.

20 Claims, 9 Drawing Sheets

BIPOLAR SHELL RESURFACED PEROVSKITE QUANTUM DOTS

FIELD OF THE INVENTION

The present invention pertains to the processing of quantum dot emissive materials, and more particularly, to resurfaced high photoluminescent quantum yield perovskite quantum dots and methods for producing them.

BACKGROUND

Quantum dots (QDs), i.e. small single crystal semiconductors containing approximately $10^2$ to $10^5$ atoms are a central topic in nanotechnology. Their small size, on the order of less than 50 nanometers, provides them with strong quantum confinement in all three dimensions and sharp density-of-state functions, allowing behavior akin to artificial atoms with defined electronic states.

Quantum dots with a perovskite crystal structure, particularly metal halide perovskites, show excellent promise as light emitting materials for display purposes owing to their high color purity (low FWHM spectral bandwidth) and high photoluminescent quantum yield (PLQY) in some cases exceeding 90%.

The manufacture of quantum dots is carried out in bulk colloidal conditions in a self-assembled, self limiting fashion to create monodisperse size distributions of dots determined by reagent concentrations and temperature. During the synthetic process, each QD is chemically bound to long chain ligands typically comprising oleylamine and oleic acid which enhance the dots' solubility, stability and passivate surface defects. Attempting to use the QDs in an electroluminescent layer in this form is problematic because the QDs are separated by many nm of organic material, severely degrading carrier mobility through such a layer. Thus, even though the dots themselves may have a high PLQY, the External Quantum Yield (EQY) of the lighting device suffers.

Substituting the long chain ligands with shorter ones can decrease the spacing of the QDs and allow formation of QD solids suitable for device fabrication, but the polar solvents used in exchanging ligands have the disadvantage of decomposing the highly ionic perovskite material, leaving anion vacancies. This hinders the electrical and optical performance of the perovskite QDs, undoing much of the benefit of exchanging the ligands.

Sanehira, et al. attempted a solid state ligand exchange rather than a solvent based process. *Enhanced mobility CsPbI3 quantum dot arrays for record-efficiency, high-voltage photovoltaic cells. Sci. Adv.* 3, eaao4204 (2017). This led to loss of PLQY and emission redshift. Wheeler, et al. tried a similar technique in *Targeted ligand-exchange chemistry on cesium lead halide perovskite quantum dots for high-efficiency photovoltaics. J. Am. Chem. Soc.* 140, 10504-10513 (2018).

Pickett, et al. attempted a shelling of halide perovskite nanoparticles with a semiconductor material with a wider band gap semiconductor material to prevent the migration of the halide anions from the core. In this case the shell materials is an inorganic semiconductor of the groups II-VI, II-VI, II-V, II-V, III-V, III-VI, IV-VI as disclosed in United States Published Patent Application 2018/0090312A1, "Shelling of halide perovskite nanoparticles for the prevention of anion exchange". However, QDs synthesized via this method gave relatively poor optical performance with maximum PLQY in the range of 30%.

It is desired to solve the electrical performance problems inherent in using organic ligands with perovskite QDs without compromising the structure, stoichiometry, or photoluminescence of the QDs.

SUMMARY OF THE INVENTION

Aspects of the instant disclosure provide improved methods of preparing perovskite quantum dots by addressing deficiencies in prior art methods. Quantum dot decomposition by the loss of halide anions is reversed by shelling the QDs with a sodium halide bipolar shell. Carrier mobility and external quantum efficiency are enhanced by tighter packing of QDs in films comprising the same. Embodiments achieve up to 100-fold increases in carrier mobility over prior art metal lead halide QDs.

Embodiments achieve up to 40× reduced trap density compared with previously-reported low-dimensional perovskite solids. Embodiments provide blue-emitting QD films that exhibit photoluminescence quantum yields (PLQYs) exceeding 90%. Levering the improved mobility, in a non-limiting example, CsPbBr3 QD-based efficient blue- and green light-emitting diodes (LEDs) are fabricated. The blue devices, which exploit the low trap density of the QD solids, achieve an external quantum efficiency (EQE) of 12.3%; and the green devices achieve an EQE of 22%.

According to one aspect of the instant disclosure, a method of preparing a quantum dot colloid comprises the steps of combining monodisperse halide perovskite quantum dots (QDs), the QDs composed of $[M^+]Pb[Ha^-]_3$ and having outer surfaces deficient in [Ha−], with an alkyl ammonium salt comprising [Ha$^-$] as the anion to bind to [Ha−] vacancies in the QD surface, thereby producing QDs nondeficient in [Ha$^-$], each QD substantially surrounded by a shell comprising the alkyl groups in the alkyl ammonium salt, and exposing the QDs to a $Na^+[Ha^-]$ salt, thereby replacing the alkyl ammonium cations in the shell with $Na^+$ cations, wherein [M$^+$] is a metal or organic cation with an oxidation state of +1 and [Ha$^-$] is a halide anion.

According to a second aspect of the instant disclosure, A quantum dot colloidal ink is provided comprising an organic solvent and a plurality of perovskite quantum dots (QDs). The QDs are composed of $[M^+]Pb[Ha^-]3$ and have outer surfaces covered in a sodium halide shell, wherein the halide anions in the shell occupy [Ha$^-$] sites in the perovskite lattice, and the sodium cations are electrostatically bound to the fixed halide anions. [M$^+$] consists of a metal or organic cation with an oxidation state of +1 and [Ha$^-$] is a halide anion.

In some embodiments of any of the above aspects, [M$^+$] is a member of the set consisting of Cs$^+$ and formamidinium.

In some embodiments of any of the above aspects, [Ha$^-$] is a member of the set consisting of chloride, bromide, and iodide.

In some embodiments of any of the above aspects, the alkyl ammonium salt is an isopropyl ammonium salt.

In some embodiments of any of the above aspects, the alkyl ammonium salt is provided in a mixture of DMF and toluene.

In some embodiments of any of the above aspects, the quantum dots deficient in [Ha−] are polyhedral in shape.

In some embodiments of the first aspect,

In some embodiments of any of the above aspects, the quantum dots are substantially free of organic ligand molecules.

In some embodiments of the second aspect, the organic solvent comprises a mixture of DMF and toluene.

According to a third aspect of the instant disclosure, a semiconductor device is provided comprising an electroluminescent layer composed of a plurality of monodisperse halide perovskite quantum dots (QDs). The QDs are composed of [M$^+$]Pb[Ha$^-$]3 wherein [M$^+$] is a metal or organic cation with an oxidation state of +1 and [Ha$^-$] is a halide anion. The electroluminescent layer is substantially free of organic ligand molecules, and the mean interdot gap is less than 0.4 nm.

In some embodiments of the third aspect, the quantum dots are polyhedral in shape.

In some embodiments of the third aspect, more than 20% of the polyhedral quantum dots are less than 0.4 nm away from another quantum dot along an entire polyhedral edge or face.

In some embodiments of the third aspect, the semiconductor device further comprises a hole transport layer adjacent the electroluminescent layer, an electron transport layer adjacent the electroluminescent layer, an anode in electrical contact with the hole transport layer, and a cathode in electrical contact with the electron transport layer.

According to a fourth aspect of the instant disclosure, a method is provided of forming a quantum dot light emissive layer. First, a quantum dot colloidal ink is solution processed onto a substrate. The colloidal ink comprises an organic solvent and a plurality of monodisperse halide perovskite quantum dots (QDs), the QDs composed of [M$^+$]Pb[Ha$^-$]3 and having outer surfaces covered in a sodium halide shell. The halide anions in the shell occupy [Ha$^-$] sites in the perovskite lattice, and the sodium cations are ionically bound to the fixed halide anions. [M$^+$] consists of a metal or organic cation with an oxidation state of +1, and [Ha$^-$] is a halide anion.

DETAILED DESCRIPTION OF THE INVENTION

Figure 1:
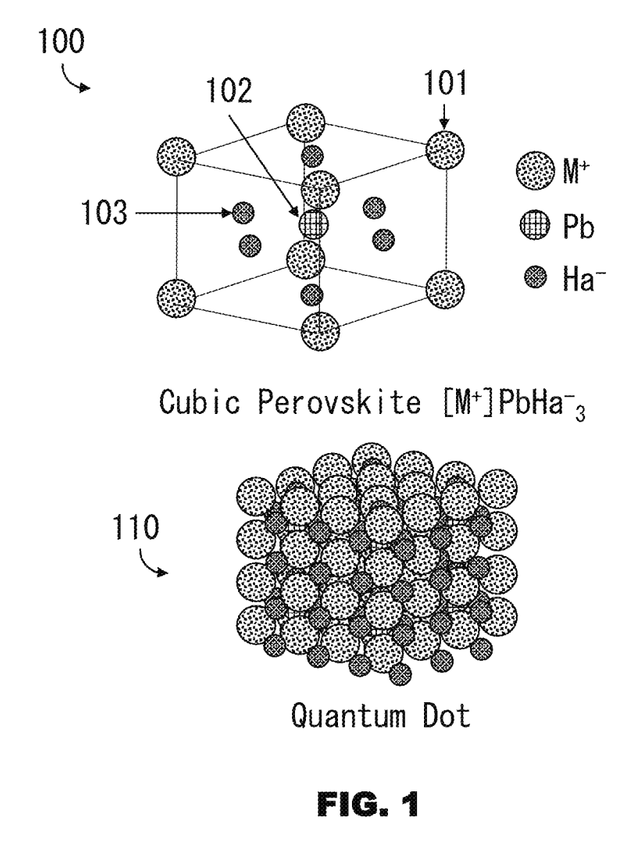
FIG. 1 is a diagram of the cubic perovskite lattice structure populated by the metal (or in some embodiments organic) cation, lead, and halide anions, and a representation of a quantum dot formed from this crystal lattice structure.

With reference to FIG. 1, a cubic perovskite crystal lattice 100 has atoms at the corners, face centers, and body center of a cubic lattice cell. The quantum dots referred to in the embodiments of the present invention have a Pb atom 102 at the body center, the halide anions 103 at the face centers, and the metal (or organic) cations 101 (hereafter referred to as [M$^+$]) at the corners. [M$^+$] 101 can comprise Cs$^+$ or formamidinium (FA), CH(NH$_2$)$_2$$^+$. The halide anion 103, hereafter referred to as [Ha$^-$] can comprise Br$^-$, I$^-$, or Cl$^-$. A perovskite quantum dot 110 refers to a single crystal of this structure, on the order of 2 to 20 or more nanometers in diameter and providing strong quantum confinement in all three spatial dimensions, leading to well defined electron and hole energy states analogous to those found in atoms.

Quantum dots are synthesized, as is well known in the art, by colloidal methods, for example, room temperature antisolvent precipitation from [M$^+$][Ha$^-$] and Pb[Ha$^-$] in the presence of ligands oleylamine and oleic acid, or hot injection of [M$^+$] oleate into Pb [Ha$^-$] in a ligand solution. As synthesized and commonly sold, perovskite quantum dots are monodisperse in size distribution and still have long chain organic ligands attached, such as oleylamine and oleic acid.

Figure 2:
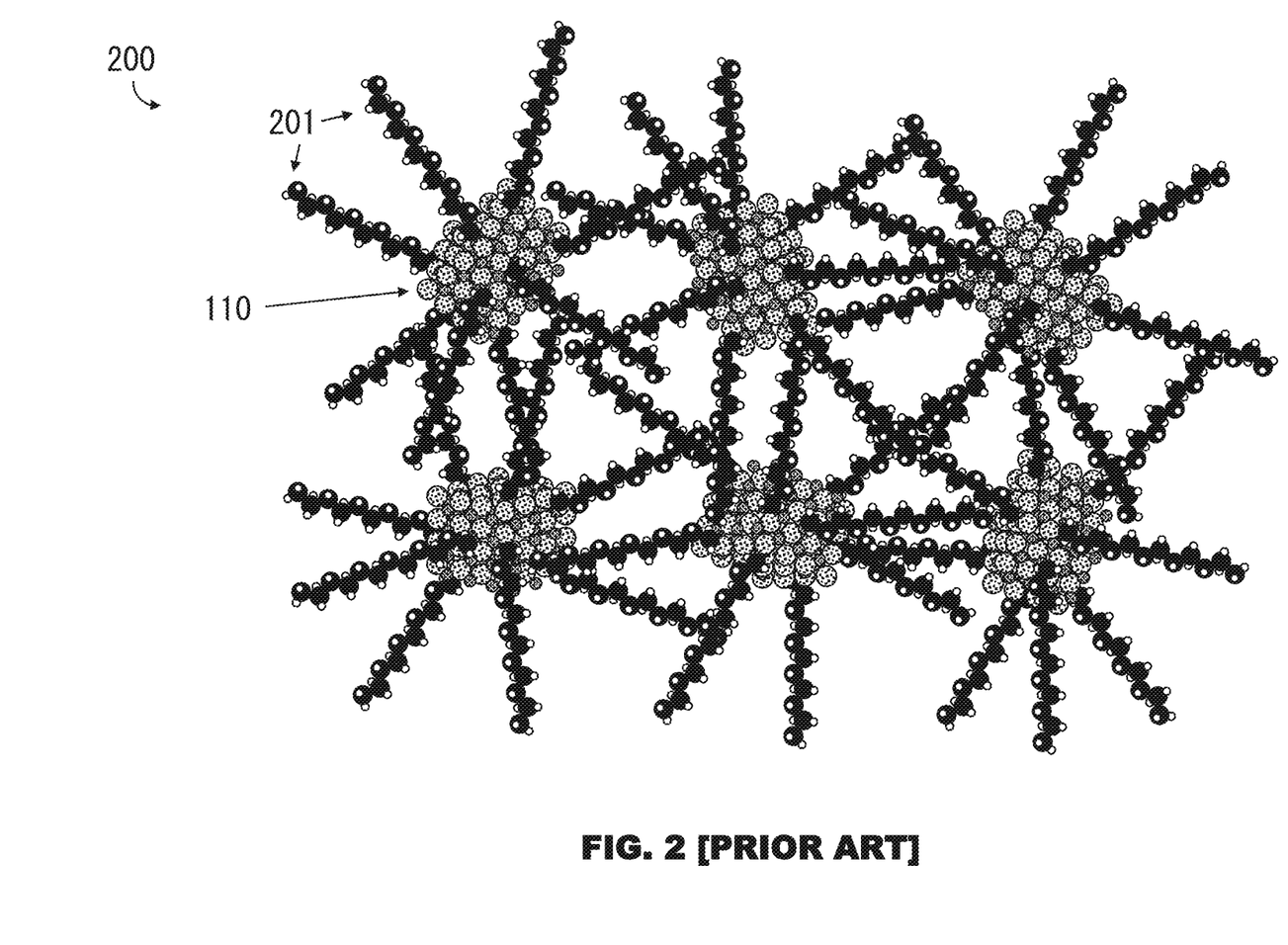
FIG. 2 is an atomic-level illustration of a perovskite quantum dot solid film incorporating long-chain ligands of the prior art.

While the ligands perform an important function of passivation and solubility enhancement in organic solvents, and do not interfere with photoluminescence in the colloidal state, they hinder the efficiency of solid state devices formed using ligand-passivated quantum dots. With reference to FIG. 2, a solid state film 200 composed of quantum dots 110 cladded with ligands 201 cannot achieve a high packing density of quantum dots 110. Carrier tunneling from one QD to the next is hampered by the relatively large thickness of energy barrier present between QDs.

Figure 3:
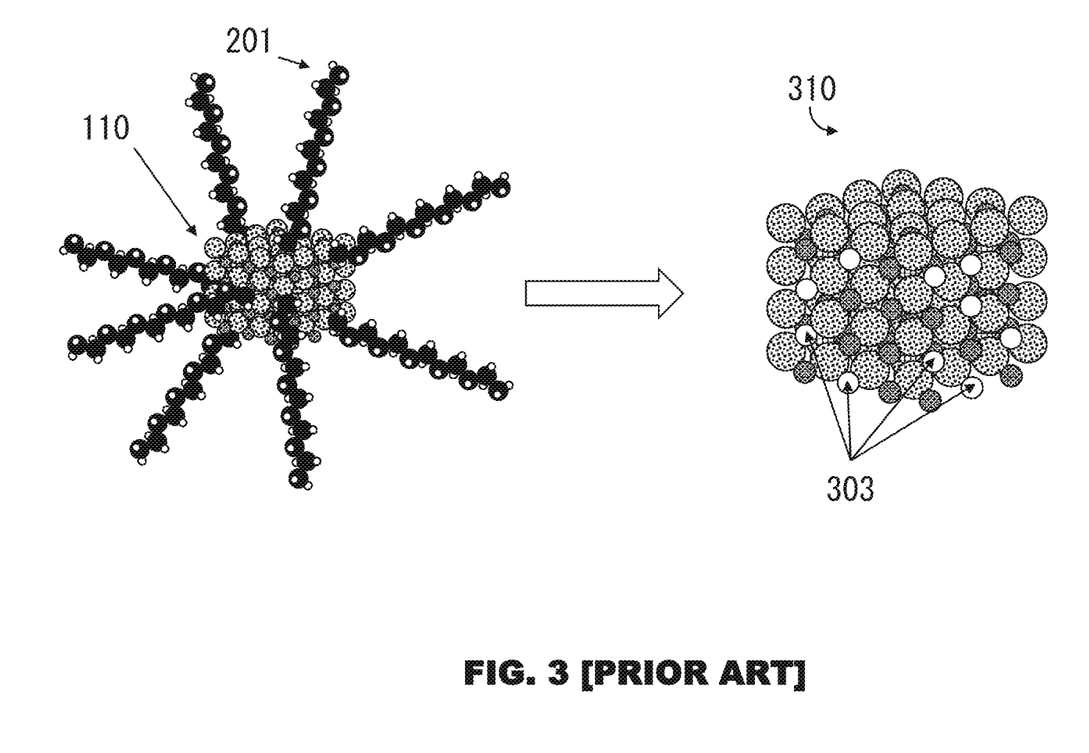
FIG. 3 illustrates a deficiency in prior art ligand replacement methods in which polar solvents pull out halide anions from the perovskite lattice, leaving vacancies.

To remove the ligands, the first step in preparing quantum dots for use in a solid state film is purification. With reference to FIG. 3, ligand-containing QDs 110 suspended in toluene are combined with an antisolvent, for example methyl acetate. This causes the ligands 201 to detach from the QDs 110, which precipitate out and can be easily separated from the solution using a centrifuge. However, not only the ligands are removed from the QD surface. Due to dynamic organic ligand binding to the QD surface, surface bromide anions were lost during the precipitation process. Vacancies 303 exist in each ligand-free quantum dot 310 where halide atoms should be. Furthermore, after purification, QDs 310 may be changed in shape to polyhedral, minimizing their surface energy (not shown), An object of the present invention is to provide a method of quantum dot processing which allows close packing of quantum dots by removing the long chain ligands, but avoids the prior art problems of Sanehira, et al. and Pickett, maintaining good photoluminescent quantum yield (PLQY) of QDs and external quantum yield (EQY) of light-emitting devices.

Figure 4:
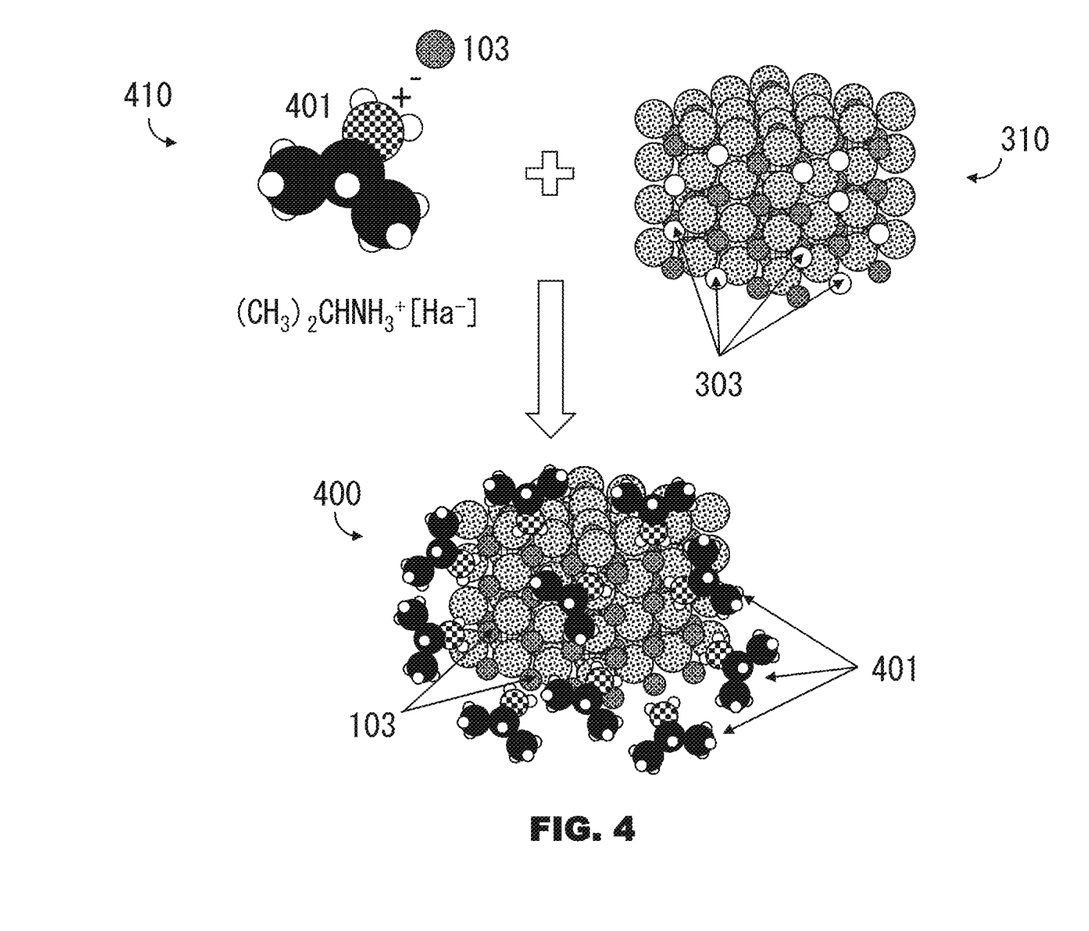
FIG. 4 depicts the use of an alkylammonium halide solution, according to an embodiment of the invention, to repopulate halide anions into vacancies left by ligand stripping.

In an embodiment of the present invention, with reference to FIG. 4, the halide deficiency 303 of the purified quantum dots 310 is addressed by adding to the suspension a solution of an alkyl ammonium halide salt 410, for example isopropylammonium bromide (IPAm$^+$Br$^-$) if the quantum dot is a bromide perovskite. The missing halide ion 103 must be present in the alkyl ammonium salt 410 in order to fill vacancies 303.

It will be noted that this step does not merely restore the halide balance, but according to electrokinetic potential measurements, it creates a halide ion rich surface. The superstoichiometric halide ions create a net charge on the quantum dot, causing the positively charged ammonium end of the cation 401 to be electrostatically adsorbed onto the outer surface of the QD, effectively creating a shell of the nonpolar isopropyl (or other alkyl) group surrounding the QD 400. This effect is confirmed by measuring the electrokinetic potential (or ζ-potential) of the colloid at this step.

In general, the electrokinetic or ζ-potential is assumed to be the electrostatic potential at the electrokinetic slip plane arbitrarily dividing the liquid medium in the immobile layer at the solid surface of the QD (e.g. the adsorbed IPAm⁺) from the bulk of the solution (e.g. dimethyl formamide [DMF], toluene, etc.).

Figure 7:
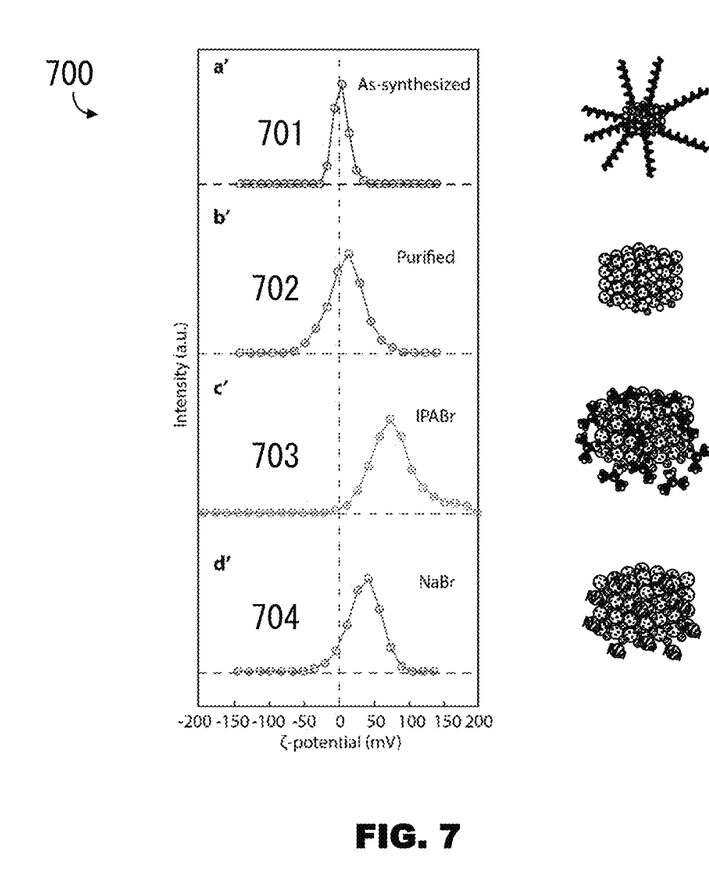
FIG. 7 is a series of plots of the ζ-potentials of perovskite QD particles at various steps in the bipolar shell resurfacing process according to an embodiment of the invention.

Referring to FIG. 7, a graph 700 is presented of ζ-potential of a colloidal suspension of QDs being treated by a method according to an embodiment of the present invention. When in the ligand-cladded state, the ζ-potential is negligible, as shown by plot 701 (labelled "a"). Purification, which causes anion loss in the QD, creates a weak positive ζ-potential as shown in plot 702 (labelled "b'"). The alkyl ammonium halide replacement step restores the charge neutrality of the QD itself, but moves the electrokinetic slip plane to the adsorbed alkyl ammonium cations, which is characterized by a larger positive charge distribution. Plot 703 (labelled "c'") shows that this is the point in the process where the ζ-potential is the highest. Plot 704 (labelled "d'") shows a reduction in ζ-potential during the final sodium halide treatment, to be discussed in greater detail below.

Figure 5:
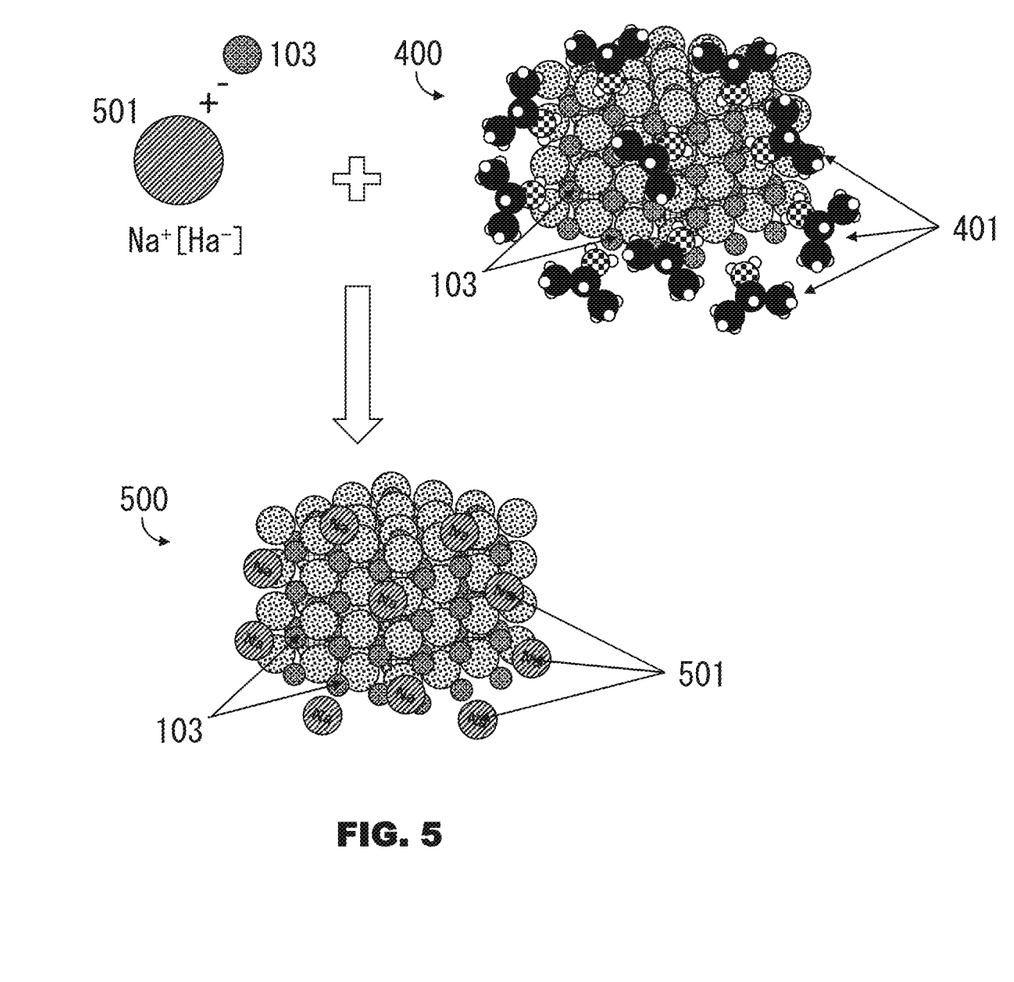
FIG. 5 is an illustration of the use of a sodium halide solution to perform cation replacement of the alkylammonium with sodium, forming a bipolar shell resurfaced quantum dot according to an embodiment of the invention.

The isopropyl ammonium group 401 is much smaller than the original long-chain ligand which may contain over a dozen carbon atoms, and it presents much less of a barrier to carrier mobility if incorporated into a solid QD film, but this can be improved further. To maximize coupling in the solid state, a final shell comprising a small monatomic cation is desired. An ion exchange step is performed using a saturated Na[Ha⁻] solution, in some embodiments NaBr, in, for example, DMF. With reference to FIG. 5, the same species of halide 103 is used in order to avoid any exchange of anion. The affinity of Na⁺ cation 501 for the halide anion 103 in QD 400 is stronger than the affinity of IPAm⁺ cation 401 for said halide anion 103. Thus, IPAm⁺ cations 401 are replaced by Na⁺ cations 501, the IPAm⁺ cations 401 going into solution. The observed positive ζ-potential value on plot 704 indicates that the bipolar shell structure remains intact. The reduction in ζ-potential implies that the cation concentration in the outer QD shell is decreased after NaBr/DMF exchange, a finding that is ascribed to the limited solubility of NaBr in DMF.

The method according to an embodiment of the invention is generally applicable across the family of inorganic and hybrid organic/inorganic perovskite quantum dots. Compositions and geometries may vary within known examples of photoluminescent perovskite QDs. In a non-limiting example, CsPbBr₃ nanoplatelets were shelled with IPAmBr and NaBr, achieving blue PL with QY of 56%. In a further nonlimiting example, CsPbBr₃ QDs of diameter 4 nm achieved turquoise PL with QY of 91%. Table 1 lists other non-limiting examples of compositions and dot sizes with resulting PL colors and quantum yields.

TABLE 1

Examples of perovskite QD compositions and geometries treated with bipolar shell resurfacing

| Composition | Diameter | PL Colour | Quantum Yield |
| --- | --- | --- | --- |
| CsPbBr$_3$ | 4 nm | Cerulean | 91% |
| CsPbBr$_3$ | 5.5 nm | Turquoise | 94% |
| CsPbBr$_3$ | 7 nm | Cyan | 97% |
| FAPbBr$_3$ | 9 nm | Cyan | 92% |
| CsPbI$_3$ | 6 nm | Crimson | 90% |

In a further embodiment of the invention, the colloidal suspension of quantum dots shelled in a bipolar sodium halide layer serves as an ink usable for the creation of solid quantum dot films for photoluminescent coatings, electroluminescent lighting devices, light emitting diodes, and other applications. The ink system comprises the quantum dots, which are substantially free of organic ligand molecules, the long-chain ligands and short alkyl groups having been removed by the purification centrifuge step and the sodium cation exchange, respectively. The ink also comprises the solvent mixture of DMF and toluene. Ratios of DMF to toluene vary approximately around 2:3, with the toluene portion being preferentially greater than the DMF portion.

In an additional aspect, the colloidal quantum dot ink is solution processed onto substrates in order to create solid state quantum dot films for use in lighting devices such as LEDs. Solution processing in this context includes such techniques as spin coating, ink jet printing, sol-gel processing, spray coating, screen printing, dipping, or any other technique involving depositing the ink in a fluid state onto a substrate where the colloid loses solvent through evaporation before condensing into a solid mass or film.

Figure 6:
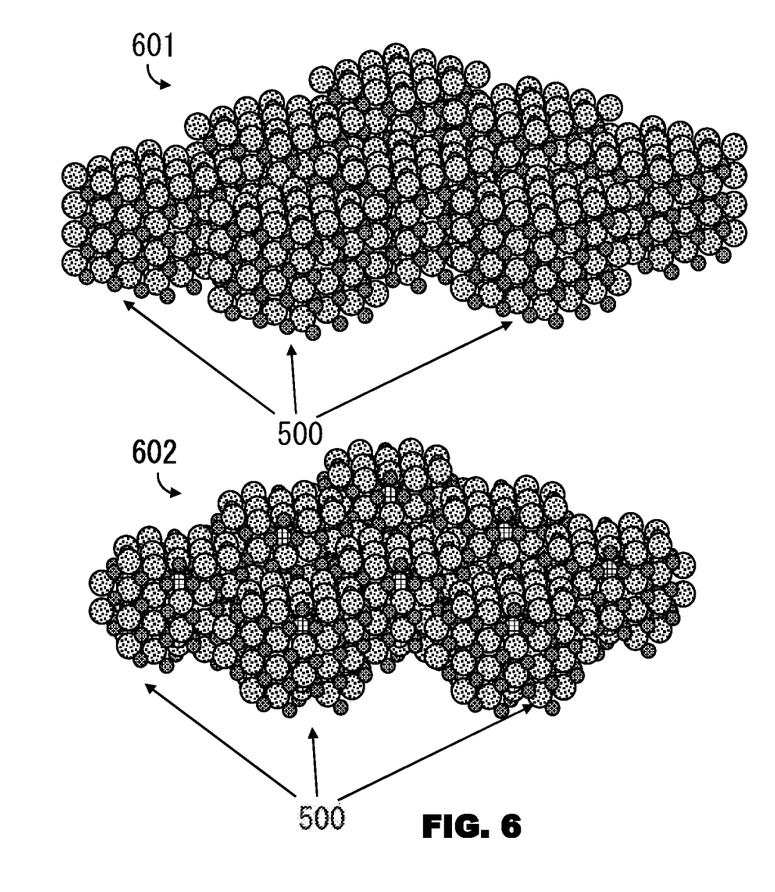
FIG. 6 is a representation of solid films cast from perovskite quantum dots of cubic or other polyhedral shapes with edge and/or face coordination according to an embodiment of the invention.

As shown in FIG. 6, quantum dots 500 deposited using the method according to an embodiment of the invention line up in regular ordered patterns to form films 601 with interdot spacings or gaps on the order of atomic spacing, or less than 0.4 nm. Without the steric effects of large organic ligand molecules, individual dots can coordinate with one another, edges or faces potentially being parallel with those of neighboring dots. Film 601 is formed from cubic QDs, whereas film 602 is formed from polyhedral QDs that have rearranged into a lower surface energy state during purification, i.e. ligand removal.

Figure 8:
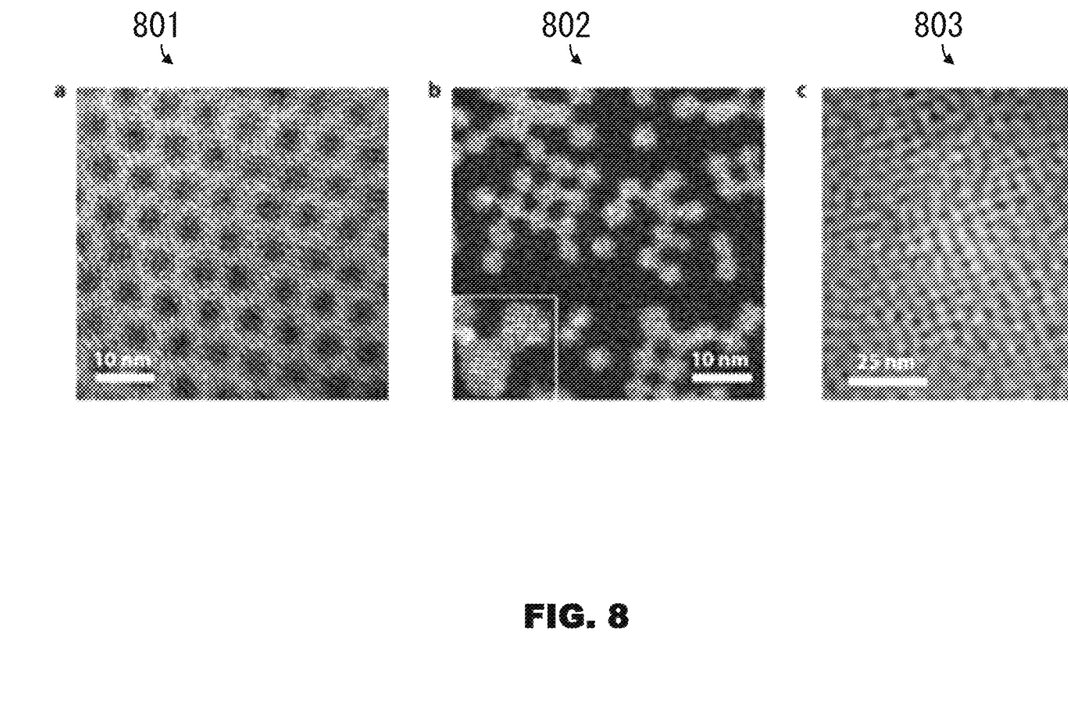
FIG. 8 is a set of TEM micrographs of QD films assembled from perovskite QDs with long chain ligands and with the resurfacing process according to an embodiment of the invention.

FIG. 8 provides a comparison of the morphology of QD films deposited using ligand-spaced QDs versus bipolar shell resurfaced QDs according to an embodiment of the present invention. TEM micrograph 801 (labelled "a") depicts 5-6 nm wide QDs with an interdot spacing on the order of 2-3 nm, the space between dots being filled by aliphatic hydrocarbon material which does not provide electrical conductivity. The arrangement is orderly but not efficient from a carrier transport perspective. TEM micrograph 802 (labelled "b") shows the beginning of self-assembly of a QD network by 4 nm QDs processed according to a method of the present invention. The QDs are developing a regular arrangement with nearly intimate contact, coming within an interatomic plane spacing of one another, as visible in the inset of micrograph 802. TEM micrograph 803 (labelled "c") shows a fully self-assembled QD film according to an embodiment of the invention with short-range order and long-range amorphousness.

Such closely spaced QDs provide the technical benefit of a film with up to a 100× increased carrier mobility (≥0.01 cm²/V s) and a 40× reduced trap density compared with previously-reported low-dimensional perovskite solids.

Embodiments of the invention provide blue-emitting QD films that exhibit photoluminescence quantum yields (PLQYs) exceeding 90%.

A pattern or distribution of the QD film onto the substrate can be defined through direct printing, or by blanket deposition followed by patterning techniques including photolithography and etching, laser ablation, liftoff, abrasion, masked particle blasting, or any other selective removal technique.

Figure 9:
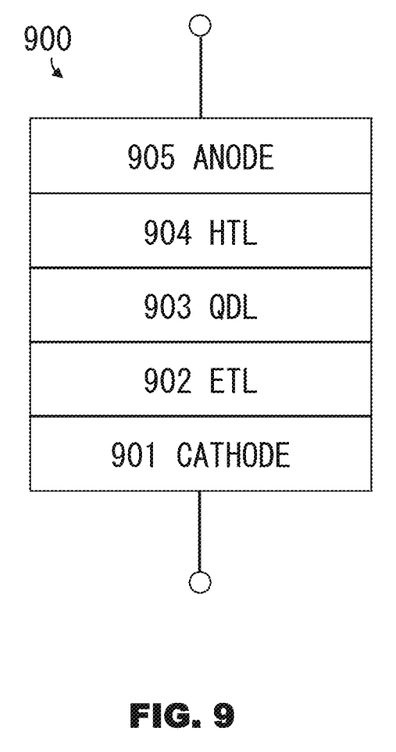
FIG. 9 is a schematic drawing of an LED comprising a perovskite quantum dot layer according to an embodiment of the present invention.

To form light emitting diodes, additional supporting layers such as the hole transport layer, electron transport layer, anode, and cathode are provided on the substrate using techniques known in the art to provide electrical connection and avoidance of unintentional carrier recombination. Referring to FIG. 9, a schematic drawing of a perovskite quantum dot LED 900 according to an embodiment of the invention is shown. Cathode 901 may be formed from a conductive material such as a metal or 2D conductor such as graphene or borophene, or a semiconductor such as LiF, to carry a negative potential for biasing the LED. The main requirement of the cathode is that it has a low work function. In electrical contact with the cathode, an n-type electron transport layer (ETL) 902 is deposited. One possible ETL is 2,2',2"-(1,3,5-Benzinetriyl)-tris(1-phenyl-1-H-benzimidazole), hereafter called TPBi. In electrical contact with ETL 902 is deposited the quantum dot layer 903 by solution processing such as, in non-limiting examples, drop casting or spin coating. The QDL 903 is intrinsic, i.e. undoped. On the opposite side of the QDL from the ETL is deposited a p-type hole transport layer (HTL) 904. One example of a HTL used in OLEDs is poly[bis(4-phenyl)(2,4,6-trimethylphenyl)amine, from the family of polytriarylamines, hereafter known as PTAAs. Finally, electrically connected to the HTL is provided an anode 905, preferably a conductor or semiconductor with a high work function, to provide positive potential to the LED. Indium Tin Oxide is often chosen as this material to overlay light emitting layers due to its transparency, conductivity, and work function.

Although in the above stated example and FIG. 9, the order of the layers is presented from cathode to anode, other embodiments in which the order is reversed are possible without departing from the scope of the disclosure.

Leveraging the improved mobility, in an example embodiment, $CsPbBr_3$ QD-based efficient blue and green light-emitting diodes (LEDs) are provided. The blue devices, which exploit the low trap density of the QD solids, achieve an external quantum efficiency (EQE) of 12.3%; and the green devices achieve an EQE of 22%.

The blue devices exhibit a narrow emission linewidth of ≤20 nm compared with reported LEDs (>25 nm) LEDs based on resurfaced QDs show lower turn-on voltages (only ~0.1 eV above the bandgap). LEDs from resurfaced perovskite QD solids show no measurable shift in EL spectral peak over time under applied bias.

The best blue perovskite LEDs have thus far exhibited limited operational stability (<10 min T50), a finding attributed to ion migration with the aid of surface traps. Devices made using bipolar-shelled QDs showed enhanced stability: a 60 min T50 at 1200 cd/m2 for the green LEDs and a 20 min T50 at 90 cd/m2 for blue, ~5 times longer than the best reported blue perovskite LEDs without EL spectra shift, indicating that QD inks form films with an enhanced combination of surface passivation and mobility.

Although the present invention has been described with reference to specific features and embodiments thereof, it is evident that various modifications and combinations can be made thereto without departing from the invention. The specification and drawings are, accordingly, to be regarded simply as an illustration of the invention as defined by the appended claims, and are contemplated to cover any and all modifications, variations, combinations or equivalents that fall within the scope of the present invention.

What is claimed:

1. A method of preparing a quantum dot colloid comprising the steps of:
   combining perovskite quantum dots (QDs), the QDs composed of $[M^+]Pb[Ha^-]3$ and having outer surfaces deficient in $[Ha^-]$, with an alkyl ammonium salt comprising $[Ha^-]$ as the anion to bind to $[Ha^-]$ vacancies in the QD surface, thereby producing QDs nondeficient in $[Ha^-]$, each QD substantially surrounded by a shell comprising the alkyl groups in the alkyl ammonium salt; and
   exposing the QDs to a $Na^+[Ha^-]$ salt, thereby replacing the alkyl ammonium cations in the shell with $Na^+$ cations;
   wherein $[M^+]$ is denotes a metal or organic cation with an oxidation state of +1 and each $[Ha^-]$ independently denotes any halide anion.

2. The method of claim 1 wherein $[M^+]$ is a member of the set consisting of $Cs^+$ and formamidinium.

3. The method of claim 1 wherein each $[Ha-]$ independently denotes any halide anion selected from the set consisting of chloride, bromide, and iodide.

4. The method of claim 1 wherein the alkyl ammonium salt is an isopropyl ammonium salt.

5. The method of claim 1 wherein the alkyl ammonium salt is provided in a mixture of DMF and toluene.

6. The method of claim 1 wherein the quantum dots deficient in $[Ha^-]$ are polyhedral in shape.

7. A quantum dot colloidal ink comprising:
   an organic solvent; and
   a plurality of perovskite quantum dots (QDs), the QDs composed of $[M^+]Pb[Ha^-]3$ and having outer surfaces covered in a sodium halide shell;
   wherein the halide anions in the shell occupy $[Ha^-]$ sites in the perovskite lattice, and the sodium cations are electrostatically bound to the fixed halide anions;
   wherein $[M^+]$ denotes a metal or organic cation with an oxidation state of +1 and each $[Ha^-]$ independently denotes any halide anion.

8. The quantum dot colloidal ink of claim 7 wherein the quantum dots are substantially free of organic ligand molecules.

9. The quantum dot colloidal ink of claim 7 wherein the organic solvent comprises a mixture of DMF and toluene.

10. The quantum dot colloidal ink of claim 7 wherein $[M^+]$ is a member of the set consisting of $Cs^+$ and formamidinium.

11. The quantum dot colloidal ink of claim 7 wherein each $[Ha^-]$ independently denotes any halide anion selected from the set consisting of chloride, bromide, and iodide.

12. A semiconductor device comprising:
   an electroluminescent layer composed of a plurality of monodisperse halide perovskite quantum dots (QDs), the QDs composed of $[M^+]Pb[Ha^-]3$ wherein $[M^+]$ is a metal or organic cation with an oxidation state of +1 and $[Ha^-]$ is a halide anion;
   wherein the electroluminescent layer is substantially free of organic ligand molecules; and
   the mean interdot gap is less than 0.4 nm.

13. The semiconductor device of claim 12 wherein the quantum dots are polyhedral in shape.

14. The semiconductor device of claim 13 wherein more than 20% of the polyhedral quantum dots are less than 0.4 nm away from another quantum dot along an entire polyhedral edge.

15. The semiconductor device of claim 13 wherein more than 20% of the polyhedral quantum dots are less than 0.4 nm away from another quantum dot along an entire polyhedral face.

16. The semiconductor device of claim 12 further comprising a hole transport layer adjacent the electroluminescent layer, an electron transport layer adjacent the electroluminescent layer, an anode in electrical contact with the hole transport layer, and a cathode in electrical contact with the electron transport layer.

17. The semiconductor device of claim 12 wherein [M$^+$] is a member of the set consisting of Cs$^+$ and formamidinium.

18. The semiconductor device of claim 12 wherein [Ha$^-$] is a member of the set consisting of chloride, bromide, and iodide.

19. A method of forming a quantum dot light emissive layer comprising the step of:

Solution processing onto a substrate a quantum dot colloidal ink comprising: an organic solvent; and a plurality of monodisperse halide perovskite quantum dots (QDs), the QDs composed of [M$^+$]Pb[Ha$^-$]3 and having outer surfaces covered in a sodium halide shell;

wherein the halide anions in the shell occupy [Ha$^-$] sites in the perovskite lattice, and the sodium cations are ionically bound to the fixed halide anions;

wherein [M$^+$] denotes a metal or organic cation with an oxidation state of +1 and each [Ha$^-$] independently denotes any halide anion.

20. The method of claim 19 wherein

[M$^+$] is a member of the set consisting of Cs$^+$ and formamidinium;

each [Ha$^-$] is a member of the set consisting of chloride, bromide, and iodide;

the quantum dot light emissive layer is substantially free of organic ligand molecules; and the mean interdot gap is less than 0.4 nm.

* * * * *